(12) United States Patent
Okonogi

(10) Patent No.: US 6,323,109 B1
(45) Date of Patent: Nov. 27, 2001

(54) LAMINATED SOI SUBSTRATE AND PRODUCING METHOD THEREOF

(75) Inventor: Kensuke Okonogi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/187,846

(22) Filed: Nov. 6, 1998

(30) Foreign Application Priority Data

Nov. 10, 1997 (JP) .................................. 9-307719

(51) Int. Cl.$^7$ ............................ H01L 21/30; H01L 21/46

(52) U.S. Cl. ......................... 438/459; 438/455; 438/977

(58) Field of Search ................... 438/455, 456, 438/457, 458, 459; 118/672, 718, 65, 67

(56) References Cited

U.S. PATENT DOCUMENTS

| | | | |
|---|---|---|---|
| 4,837,172 | 6/1989 | Mizuno et al. | 437/11 |
| 5,374,564 | 12/1994 | Bruel | 437/24 |
| 5,476,813 | 12/1995 | Naruse | 437/132 |
| 5,633,174 | 5/1997 | Li | 438/475 |
| 5,710,057 | * 1/1998 | Kenney | 437/62 |
| 5,714,395 | * 2/1998 | Bruel | 437/24 |
| 5,854,123 | * 12/1998 | Sato et al. | 438/507 |
| 5,877,070 | * 3/1999 | Goesele et al. | 438/458 |
| 5,882,987 | * 3/1999 | Srikrishnan | 438/458 |
| 5,953,622 | * 9/1999 | Lee et al. | 438/458 |
| 6,083,324 | * 7/2000 | Henley et al. | 148/33.2 |

FOREIGN PATENT DOCUMENTS

| | | | |
|---|---|---|---|
| 0352801 | 1/1990 | (EP) | H01L/29/167 |
| 05006883 | 1/1993 | (EP) | H01L/21/304 |
| 06061235 | 3/1994 | (EP) | H01L/21/322 |
| 08293589 | 11/1996 | (EP) | H01L/27/12 |
| 08316442 | 11/1996 | (EP) | H01L/27/12 |
| 0767486 | 4/1997 | (EP) | H01L/21/20 |
| 1-259539 | 10/1989 | (JP) | H01L/21/322 |
| 5-6883 | 1/1993 | (JP) | H01L/1/14 |
| 5-55230 | 3/1993 | (JP) | H01L/21/322 |
| 5235007 | 9/1993 | (JP) | H01L/21/322 |
| 8-115861 | 5/1996 | (JP) | H01L/21/02 |
| 9-22993 | 1/1997 | (JP) | H01L/27/12 |
| 9162090 | 6/1997 | (JP) | H01L/21/02 |
| 9-232324 | 9/1997 | (JP) | H01L/21/322 |
| 9-260619 | 10/1997 | (JP) | H01L/27/12 |
| 10-200080 | 7/1998 | (JP) | H01L/27/12 |

OTHER PUBLICATIONS

"Cleaning and Polishing As Key Steps for Smart–Cut SOI Process"Moriceau et al Proceedings 1996 IEEE International SOI Conference, Oct. 1996.

H. Moriceau, "Cleaning and Polishing as Key Steps for Smart–Cut SOI Process", Oct. 1996, pp. 152–153, Proceedings 1996 IEEE International SOI Conference.

Abstract/Zusammenfassung/Abrege, p. 1 L. Dioccio, Silicon carbide on insulator formation by the Smart–Cut Process, 1997, 349–356, Elsevier Science.

* cited by examiner

*Primary Examiner*—John F. Niebling
*Assistant Examiner*—Viktor Simkovic
(74) *Attorney, Agent, or Firm*—Hayes, Soloway, Hennessey, Grossman & Hage, PC

(57) ABSTRACT

An insulation film is formed on a first single crystal silicon substrate, e.g., a hydrogen anneal substrate, an intrinsic gettering substrate and an epitaxial substrate. Hydrogen implantation is carried out from a surface of this insulation film, thereby forming a hydrogen implantation region in the first single crystal silicon substrate. Then, by carrying out a thermal treatment at 400 to 500° C., voids are formed in the hydrogen implantation region, and the first single crystal silicon substrate is cleaved therefrom. Next, the surface of the insulation film and a surface of a second single crystal silicon substrate are laminated and then, they are subjected to a thermal treatment at 1,000° C. or higher. With this method, the adverse influence, on a device, of defects in the substrate can be reduced and a yield can be enhanced.

6 Claims, 3 Drawing Sheets

LAMINATED SOI SUBSTRATE AND PRODUCING METHOD THEREOF

BACKGROUND OF THE INVENTION

1. Field of the Invention

The present invention relates to a laminated SOI (Silicon On Insulator) substrate for use in forming a semiconductor device and a producing method thereof, and more particularly, to a laminated SOI substrate in which the adverse influence, on a device, of defects in the substrate is reduced, and a producing method thereof.

2. Description of the Related Art

As a method for producing a super thin film SOI substrate by a lamination technique, there is known a smart-cut process utilizing a phenomenon that a semiconductor substrate is cleaved through voids formed by charging a large amount of hydrogen (Proceedings 1996 IEEE International SOI conference, p152). FIGS. 1A to 1E are sectional views sequentially showing a producing method of the SOI substrate by the conventional smart-cut process.

In the producing method of the SOI substrate according to the conventional smart-cut process, silicon dioxide film 22 which is an insulation is first formed on a single crystal silicon substrate 21 as shown in FIG. 1A. A surface area of the single crystal silicon substrate 21 ultimately will be a device forming area. On the surface area, oxygen deposition or crystal defect region 28 such as nucleus of the oxygen deposition which is called a grown-in defect as a general term exists.

Next, as shown in FIG. 1B, hydrogen ion is ion implanted from a surface of the silicon dioxide film 22 in a dose amount of about $10^{16}$ to $10^{17}$ (atoms/cm$^2$). As a result, a hydrogen implanted region 23 is formed in the single crystal silicon substrate 21.

Then, as shown in FIG. 1C, a surface of the silicon dioxide film 22 and a surface of another single crystal silicon substrate 25 are laminated at room temperature, and are subjected to a thermal treatment at 400 to 500° C., thereby forming voids 24 in the hydrogen implanted region 23.

At that time, as shown in FIG. 1D, the single crystal silicon substrate 21 is cleaved through the voids 24 formed in the hydrogen implanted region 23.

Next, a thermal treatment at about 1,000° C. or higher is carried out for several hours to strongly adhere the laminated surfaces of the silicon dioxide film 22 and the single crystal silicon substrate 25. Then, a surface of the cleaved single crystal silicon substrate 21 is polished to form a mirror surface to complete the SOI substrate.

Then, the SOI substrate produced in this marier is advanced to a device forming step.

However, in the laminated SOI substrate produced by the above-described conventional method, there are problems that particles are generated in the device produced using the SOI substrate, or bonding leakage, element separation characteristic and tolerance voltage of gate insulation film are deteriorated.

SUMMARY OF THE INVENTION

It is an object of the present invention to provide a laminated SOI substrate and a producing method thereof in which the adverse influence, on a device, of defects in the substrate can be reduced and a yield can be enhanced.

A laminated SOI substrate according to the present invention comprises a first single crystal silicon substrate and a second single crystal silicon substrate laminated on each other with an insulation film interposed therebetween. In the laminated SOI substrate, the first single crystal silicon substrate has one kind of substrate selected from a group consisting of a hydrogen anneal substrate, an intrinsic gettering substrate and an epitaxial substrate.

In the present invention, hydrogen anneal substrate, intrinsic gettering substrate or epitaxial substrate is used as the first single crystal silicon substrate on which a device is to be formed. Since crystal defects on a surface area of these substrates are extremely few, voids are suppressed from being formed in the substrate during the producing process. Therefore, it is possible to reduce the adverse influence, on a device, of defects in the substrate.

A producing method of a laminated SOI substrate according to the present invention comprises the steps of: forming an insulation film on a surface of a first single crystal silicon substrate; forming a hydrogen implantation region in the first single crystal silicon substrate by carrying out hydrogen implantation from a surface of the insulation film; and laminating the surface of the insulation film and a surface of a second single crystal silicon substrate. In this producing method of the laminated SOI substrate, the first single crystal silicon substrate has one kind of substrate selected from a group consisting of a hydrogen anneal substrate, an intrinsic gettering substrate and an epitaxial substrate.

In the producing method of the laminated SOI substrate according to the present invention, the first single crystal silicon substrate includes a crystal defect region at a certain depth from a surface thereof.

In the present invention, since the first single crystal silicon substrate includes the crystal defect region at a certain depth from a surface thereof, if the hydrogen implantation is carried out, hydrogen is concentrated on the crystal defect region to form the voids for cleaving the substrate. That is, since voids are not formed in other regions, it is possible to reduce the adverse influence, on a device, of defects in the substrate.

The crystal defect region may include at least one kind of crystal defect selected from a group of misfit dislocation and oxygen deposition.

Further, in the present invention, a thermal treatment at a temperature of 1,000° or higher may be carried out after the step of laminating the surface of the insulation film and a surface of a second single crystal silicon substrate.

The misfit dislocation may be generated by forming, on a third single crystal silicon substrate, a single crystal silicon layer having a resistance higher than that of the third single crystal silicon substrate by epitaxial growth.

In order to solve the above problems, the present inventors repeated experiments, and as a result, they found that since the crystal defect region 28 (see FIG. 1A) existed irregularly in the single crystal silicon substrate 21 used in the conventional method, voids 24a were formed also in the crystal defect region 28 by the hydrogen implantation as shown in FIG. 1C, and the voids 24a remained in the single crystal silicon substrate 21 which is an active layer of the SOI substrate as shown in FIG. 1E and therefore, an adverse influence was exerted on a device produced from this SOI substrate. That is, in the producing method of the laminated SOI substrate by the smart-cut process, it is important to control the location where the voids are formed by the hydrogen implantation. The location where the voids are formed should be a location spaced from a surface where the hydrogen is implanted by a distance corresponding to a range of the hydrogen. However, if there is a region around such a location where hydrogen ion such as defect is prone to concentrate, voids may be formed in such a region. Thereupon, it is necessary to control the crystallinity on the surface of the basic single crystal silicon substrate. In the present invention, the location where the voids are formed in controlled by improving the crystallinity on the surface of the basic single crystal silicon substrate.

With this feature, according to the present invention, the voids are formed in a predetermined location in the semiconductor silicon substrate, and the semiconductor silicon substrate is cleaved in the location where the voids are formed and therefore, remaining voids can be reduced. Thus, the adverse influence, on a device, of defects in the substrate can be reduced and yield can be enhanced.

DESCRIPTION OF THE PREFERRED EMBODIMENTS

Preferred embodiments of the present invention will be explained concretely with reference to the accompanying drawings below.

Figure 1A:
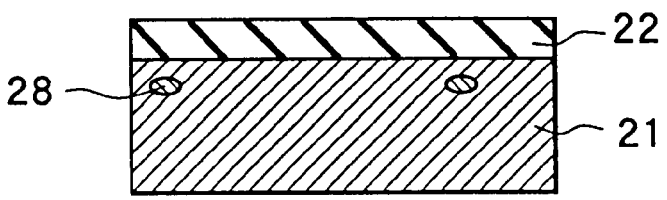
FIGS. 1A to 1E are sectional views sequentially showing a producing method of the SOI substrate by a conventional smart-cut process.
Figure 1B:
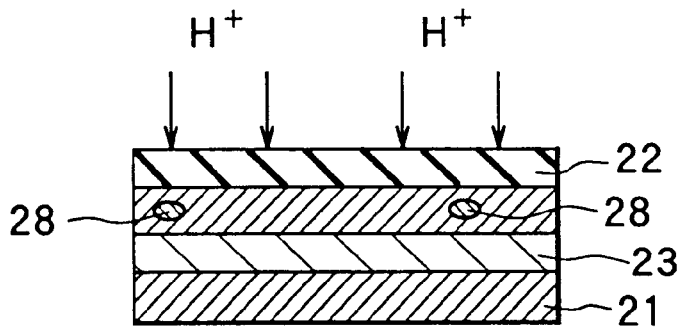
Figure 1C:
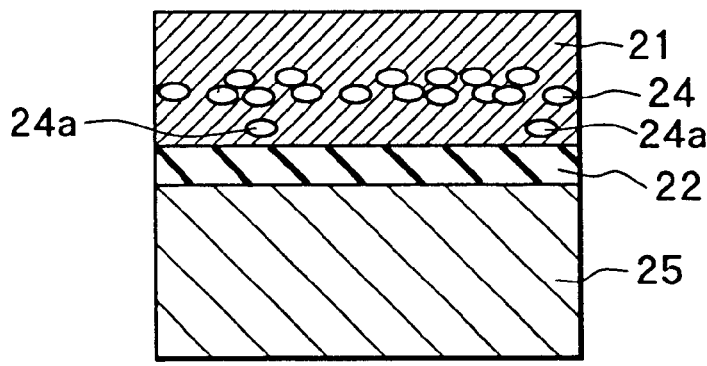
Figure 1D:
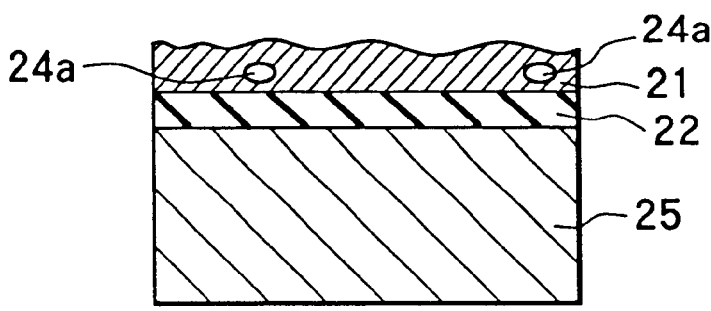
Figure 1E:
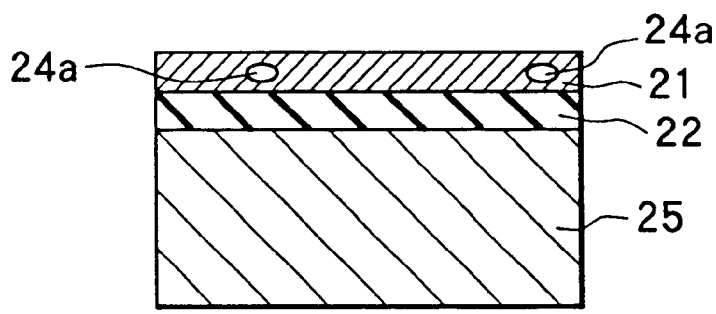
Figure 2A:
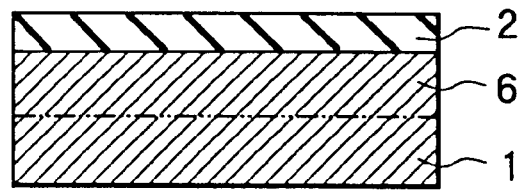
FIGS. 2A to 2E are sectional views sequentially showing a producing method of a laminated SOI substrate according to a first embodiment of the present invention.
Figure 2B:
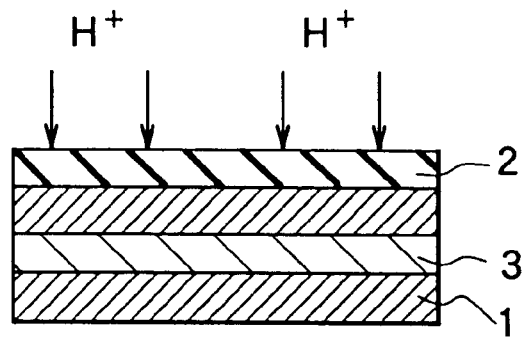

FIGS. 2A to 2E are sectional views sequentially showing a producing method of a laminated SOI substrate according to a first embodiment of the present invention, In the method of the present embodiment, as a single crystal silicon substrate 1 in which hydrogen is implanted, a substrate having no grown-in defect and no oxygen deposition on a surface of the substrate and no defect region (DZ) 6 exists on surface area as shown in FIG. 2A, such as a hydrogen anneal substrate, an intrinsic gettering (IG) substrate or an epitaxial substrate is used. The hydrogen anneal substrate is prepared by annealing a single crystal silicon material formed by the FZ method or the like at 1,200° C. for one hour in 100% hydrogen atmosphere for example. First, silicon dioxide film 2 which is an insulation material is formed on the single crystal silicon substrate 1.

Then, hydrogen ion is ion implanted from a surface of the silicon dioxide film 2 in a dose amount of about 1016 to 1017 (atoms/cm²). With this operation, a hydrogen implantation region 3 is formed in only a controlled range region of the single crystal silicon substrate 1.

Figure 2C:
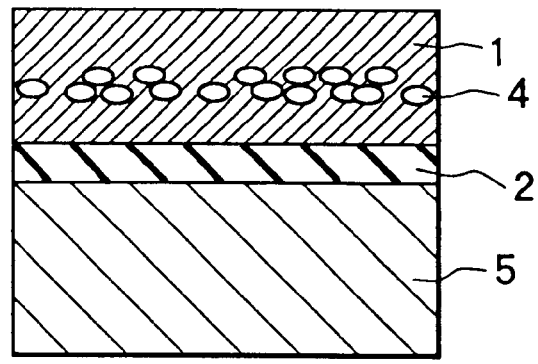

Then, as shown in FIG. 2C, a surface of the silicon dioxide film 2 and a surface of another single crystal silicon substrate 5 are laminated at a room temperature, and are subjected to a thermal treatment at 400 to 500W, thereby forming a large number of voids 4 in the hydrogen implanted region 3 at high density.

Figure 2D:
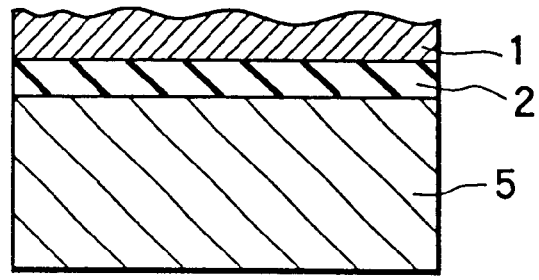

At that time, as shown in FIG. 2D, the single crystal silicon substrate 1 is cleaved through the voids 4 formed in the hydrogen implanted region 3. In the present embodiment, since there is no crystal defect region on the surface area of the single crystal silicon substrate 1, it is possible to avoid voids from remaining in the single crystal silicon substrate 1 unlike the conventional method.

Next, a thermal treatment at about 1,000° C. or higher is carried out for several hours to strongly adhere the laminated surfaces of the silicon dioxide film 2 and the single crystal silicon substrate 5. Then, as shown in FIG. 2E, a surface of the cleaved single crystal silicon substrate 1 is polished to form a mirror surface to complete the SOI substrate.

Figure 2E:
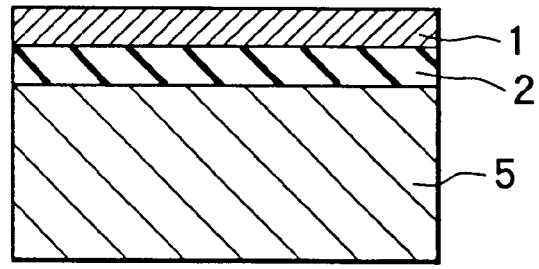

The SOI substrate produced in this manner has a structure shown in FIG. 2E, and voids do not exist therein. Therefore, when a device is produced from this SOI substrate, it is possible to prevent the adverse influence of defects in the substrate from being exerted on the device characteristics.

Next, a method of a second embodiment of the present invention will be explained. FIGS. 3A to 3E are sectional views sequentially showing a producing method of a laminated SOI substrate according to the second embodiment of the present invention, In the method of the present embodiment, as a single crystal silicon substrate 11 in which hydrogen is implanted, a substrate provided at its surface area with a misfit dislocation region 17 in which a misfit dislocation is formed. The single crystal silicon substrate 11 having the misfit dislocation region 17 can be easily formed by forming a high resistance single crystal silicon layer on a low resistance substrate by epitaxial growth, or by allowing a single crystal silicon to epitaxially grow on an SiGe layer, for example. First, a silicon dioxide film 12 which is an insulation material is formed on the single crystal silicon substrate 11.

Figure 3A:
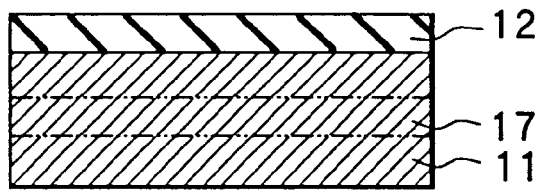
FIGS. 3A to 3E are sectional views sequentially showing a producing method of the laminated SOI substrate according to a second embodiment of the present invention.
Figure 3B:
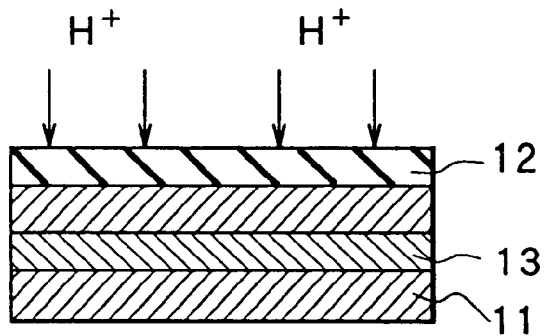

Then, as shown in FIG. 3B, hydrogen ion is ion implanted from a surface of the silicon dioxide film 12 in a dose amount of about $10^{16}$ to $10^{17}$ (atoms/cm²). With this operation, a hydrogen implantation region 13 is formed in only a controlled range region of the single crystal silicon substrate 11 and the misfit dislocation region 17.

Figure 3C:
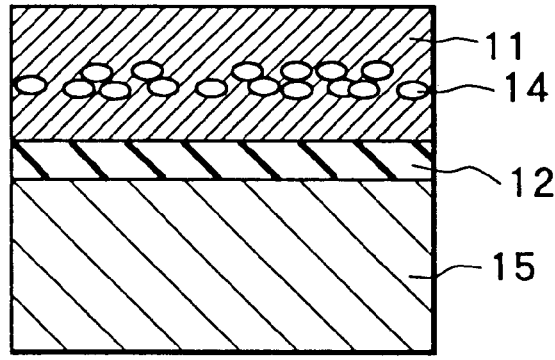

Then, as shown in FIG. 3C, a surface of the silicon dioxide film 12 and a surface of another single crystal silicon substrate 15 are laminated at a room temperature, and are subjected to a thermal treatment at 400 to 500° C., thereby forming a large number of voids 14 in the hydrogen implanted region 13 at high density.

Figure 3D:
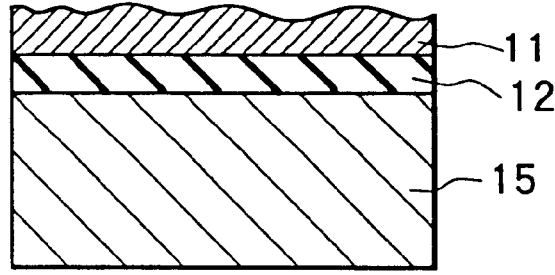

At that time, as shown in FIG. 3D, the single crystal silicon substrate 11 is cleaved through the voids 14 formed in the hydrogen implanted region 13. In the present embodiment also, since there is no crystal defect region on the surface area of the single crystal silicon substrate 11, it is possible to prevent the voids from remaining in the single crystal silicon substrate 11 unlike the conventional method.

Next, a thermal treatment at about 1,000° C. or higher is carried out for several hours to strongly adhere the laminated surfaces of the silicon dioxide film 12 and the single crystal silicon substrate 15. Then, as shown in FIG. 3E, a surface of the cleaved single crystal silicon substrate 11 is polished to form a mirror surface to complete the SOI substrate.

Figure 3E:
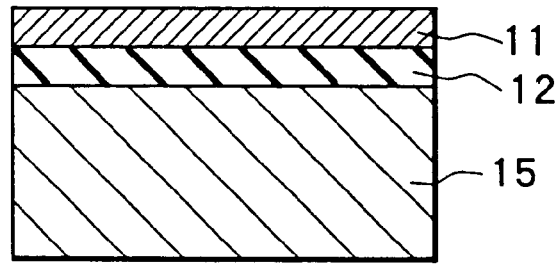

The SOI substrate produced in this manner has a structure shown in FIG. 3E, and voids do not exist therein. Therefore, as the SOI substrate produced by the method of the first embodiment, when a device is produced from this SOI substrate, it is possible to prevent the adverse influence of defects in the substrate being exerted on the device characteristics.

Although a substrate having the misfit dislocation region is used as the single crystal silicon substrate in the present embodiment, a substrate provided in its surface area with an oxygen deposition layer may be used. The substrate having the oxygen deposition layer is formed by cleaning a basic single crystal silicon substrate with hydrofluoric acid aqueous solution and they, by allowing a single crystal silicon layer to epitaxially grow on the basic single crystal silicon substrate.

What is claimed is:

1. A method for producing a laminated SOI substrate, comprising the steps of:

forming an insulation film on a surface of a first single crystal silicon substrate which has one kind of substrate selected from a group consisting of a hydrogen anneal substrate, an intrinsic gettering substrate and an epitaxial substrate;

forming a hydrogen implantation region in said first single crystal silicon substrate by carrying out hydrogen implantation from a surface of said insulation film; and laminating said surface of said insulation film and a surface of a second single crystal silicon substrate.

2. A method for producing a laminated SOI substrate, comprising the steps of:

forming an insulation film on a surface of a first single crystal silicon substrate which includes a crystal defect region at a certain depth from a surface thereof;

forming a hydrogen implantation region in said first single crystal silicon substrate by carrying out hydrogen implantation from a surface of said insulation film; and laminating said surface of said insulation film and a surface of a second single crystal silicon substrate.

3. A method according to claim 2, wherein said crystal defect region includes at least one kind of crystal defect selected from a group of misfit dislocation and oxygen deposition.

4. A method according to claim 1, further comprising a step of conducting a thermal treatment at a temperature of 1,000° C. or higher, after said step of lamination said surface of said insulation film and said surface of said second single crystal silicon substrate.

5. A method according to claim 2, further comprising a step of conducting a thermal treatment at a temperature of 1,000° C. or higher, after said step of laminating said surface of said insulation film and said surface of said second single crystal silicon substrate.

6. A method according to claim 3, wherein said misfit dislocation is generated by forming, on a third single crystal silicon substrate, a single crystal silicon layer having a resistance higher than that of said third single crystal silicon substrate by epitaxial growth.

* * * * *